(12) United States Patent
Ito et al.

(10) Patent No.: US 10,608,657 B2
(45) Date of Patent: Mar. 31, 2020

(54) ANALOG-TO-DIGITAL CONVERSION APPARATUS AND ANALOG-TO-DIGITAL CONVERSION METHOD

(71) Applicant: Mitsubishi Electric Corporation, Tokyo (JP)

(72) Inventors: Takahiro Ito, Tokyo (JP); Satoru Ishizaka, Tokyo (JP); Keiji Ninomiya, Hyogo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/330,105

(22) PCT Filed: Oct. 28, 2016

(86) PCT No.: PCT/JP2016/082162
§ 371 (c)(1),
(2) Date: Mar. 4, 2019

(87) PCT Pub. No.: WO2018/078823
PCT Pub. Date: May 3, 2018

(65) Prior Publication Data
US 2019/0253065 A1 Aug. 15, 2019

(51) Int. Cl.
*H03M 1/12* (2006.01)
*G01D 3/02* (2006.01)
*G01K 7/24* (2006.01)

(52) U.S. Cl.
CPC .......... *H03M 1/1245* (2013.01); *G01D 3/02* (2013.01); *G01K 7/24* (2013.01)

(58) Field of Classification Search
CPC .......... H03M 1/1245; G01D 3/02; G01K 7/24
(Continued)

(56) References Cited
U.S. PATENT DOCUMENTS 8,981,972 B2 * 3/2015 Shen ................ H03M 1/38
341/118
9,564,914 B1 * 2/2017 Mallett ............ H03M 1/1009
(Continued)

FOREIGN PATENT DOCUMENTS

JP 63-111432 A 5/1988
JP 4-93624 A 3/1992
(Continued)

OTHER PUBLICATIONS

International Search Report dated Jan. 31, 2017 for PCT/JP2016/082162 filed on Oct. 28, 2016, 8 pages including English Translation.

*Primary Examiner* — Brian K Young
(74) *Attorney, Agent, or Firm* — Xsensus LLP

(57) ABSTRACT

An AD conversion apparatus includes an AD conversion unit; a reference voltage switching unit that is disposed between an output of a sensor and an analog input terminal of the AD conversion unit and is connectable to the output of the sensor and a plurality of reference voltage lines; and a control unit to control switching the reference voltage input to the AD conversion unit by connecting the reference voltage switching unit to one of the reference voltage lines and to the output of the sensor. An analog output value of the sensor is input to the analog input terminal of the AD conversion unit via the reference voltage switching unit and is converted into a digital value.

12 Claims, 9 Drawing Sheets

(58) Field of Classification Search
USPC .................................................. 341/120, 155
See application file for complete search history.

(56) References Cited

U.S. PATENT DOCUMENTS 10,411,722 B2 * 9/2019 Chung .................. H03M 1/164
2015/0063421 A1 3/2015 Jin et al.

FOREIGN PATENT DOCUMENTS

| JP | 5-48457 A | 2/1993 |
| JP | 2011-247780 A | 12/2011 |
| JP | 2015-049248 A | 3/2015 |
| JP | 2015-145823 A | 8/2015 |
| JP | 2015-200633 A | 11/2015 |

* cited by examiner

US 10,608,657 B2

ANALOG-TO-DIGITAL CONVERSION APPARATUS AND ANALOG-TO-DIGITAL CONVERSION METHOD

CROSS-REFERENCE TO RELATED APPLICATIONS

The present application is based on PCT filing PCT/JP2016/082162, filed Oct. 28, 2016, which is incorporated by reference.

FIELD

The present invention relates to an analog-to-digital conversion apparatus and an analog-to-digital conversion method in which an error, produced during analog-to-digital conversion, of a physical quantity detected and output by a sensor is reduced.

BACKGROUND

Technologies for reducing errors have been under development so as to improve the accuracy or to expand the usage environment of analog-to-digital conversion apparatuses. Patent Literature 1 discloses an example of conventional technology in which a voltage dividing resistor circuit is connected to a thermistor and data converted to have linear characteristics is output. In the technology disclosed in Patent Literature 1, linear correction is performed on the temperature characteristic of the voltage output of the thermistor.

CITATION LIST

Patent Literature

Patent Literature 1: Japanese Patent Application Laid-Open No. 2015-200633

SUMMARY

Technical Problem

According to the above-described conventional technology, only errors at the stage before analog-to-digital conversion are reduced; therefore, there is a difficulty in that it is impossible to reduce errors produced during the analog-to-digital conversion.

The present invention has been made in view of the above and has an object to obtain an analog-to-digital conversion apparatus capable of reducing errors produced during analog-to-digital conversion.

Solution to Problem

To solve the aforementioned problems and achieve the object, an analog-to-digital conversion apparatus according to as aspect of the present invention includes: an analog-to-digital conversion unit; a reference voltage switching unit disposed between an output of a sensor and an analog input terminal of the analog-to-digital conversion unit and connectable to an output of the sensor and a plurality of reference voltage lines; and a control unit to control switching a reference voltage input to the analog-to-digital conversion unit by connecting the reference voltage switching unit to one of the reference voltage lines and to the output of the sensor. An analog output value of the sensor is input to the analog input terminal of the analog-to-digital conversion unit via the reference voltage switching unit and is converted into a digital value.

Advantageous Effects of Invention

An analog-to-digital conversion apparatus according to the present invention has an effect of being able to reduce errors produced during analog-to-digital conversion.

DESCRIPTION OF EMBODIMENTS

Hereinafter, an analog-to-digital conversion apparatus and an analog-to-digital conversion method according to embodiments of the present invention will be described in detail with reference to the drawings. Note that this invention is not limited by these embodiments.

Embodiment

Figure 1:
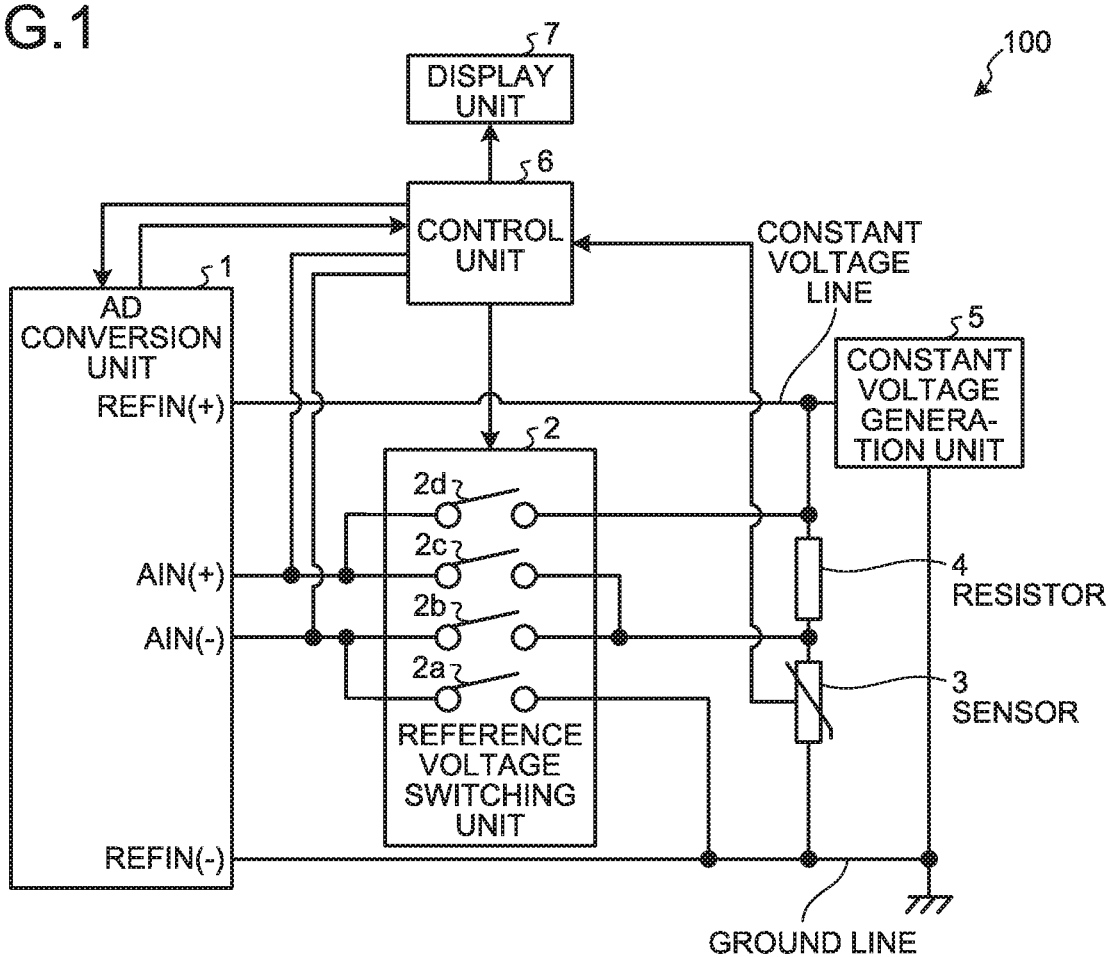
FIG. 1 is a diagram illustrating an example configuration of an analog-to-digital (AD) conversion apparatus according to an embodiment.

FIG. 1 is a diagram illustrating an example configuration of an AD conversion apparatus according to an embodiment of the present invention. An AD conversion apparatus 100 illustrated in FIG. 1 includes an AD conversion unit 1, a reference voltage switching unit 2, a sensor 3, a resistor 4, a constant voltage generation unit 5, a control unit 6, and a display unit 7. The input value of the AD conversion unit 1 or the conversion value of the AD conversion unit 1 is input to the control unit. 6 illustrated in FIG. 1, and thus the control unit 6 can switch, depending on the value input to the control unit 6, between AD conversion using a first reference voltage value as a reference and AD conversion using a second reference voltage value as a reference. Here, 0 V, which is the ground voltage, can be exemplified as the first reference voltage value and the output voltage of the constant voltage generation unit 5 can be exemplified as the second reference voltage value. The output voltage of the constant voltage generation unit 5 is the full scale upper limit value and can be exemplified by 5 V. Note that the full scale upper limit value refers to the maximum measurable value. In addition, the arrows in FIG. 1 indicate the flow of signals or data and do not indicate actual wiring.

The AD conversion unit 1 includes a positive reference input terminal denoted as REFIN(+), a negative reference input terminal denoted as REFIN(−), a positive analog input terminal denoted as AIN(+), and a negative analog input terminal denoted as AIN(−). The positive analog input terminal AIN(+) and the negative analog input terminal AIN(−) make up a differential input unit. The positive reference input terminal REFIN(+) is connected to the output of the constant voltage generation unit 5 and the negative reference input terminal REFIN(−) is grounded.

The reference voltage switching unit 2 includes a switch 2a, a switch 2b, a switch 2c, and a switch 2d. When the switches 2a and 2c are turned on while the switches 2b and 2d are turned off, a ground line having a ground voltage of 0 V is connected to the negative analog input terminal AIN(−) of the AD conversion unit 1 and the output of the sensor 3 is connected to the positive analog input terminal AIN(+) of the AD conversion unit 1, which means that a sensor output voltage value is input to the AD conversion unit 1 as a voltage difference between the positive analog input terminal AIN(+) and the negative analog input terminal AIN(−) with 0 V as the reference voltage. Furthermore, when the switches 2b and 2d are turned on while the switches 2a and 2c are turned off, a constant voltage line connected to the output of the constant voltage generation unit 5 is connected to the positive analog input terminal AIN(+) of the AD conversion unit 1 and the output of the sensor 3 is connected to the negative analog input terminal AIN(−) of the AD conversion unit 1, which means that a sensor output voltage value is input to the AD conversion unit 1 as a voltage difference between the positive analog input terminal AIN(+) and the negative analog input terminal AIN(−) with the full scale upper limit value of the AD conversion apparatus 100 as the reference voltage.

The sensor 3 is a sensor that detects a physical quantity and is disposed between the ground line and the resistor 4. Here, temperature, a resistance value, and pressure can be exemplified as the physical quantity. In the present embodiment, a thermistor is exemplified as the sensor 3 and the physical quantity to be detected is temperature. Accordingly, the AD conversion apparatus 100 illustrated in FIG. 1 can be exemplified by an AD conversion apparatus mounted on a factory automation (FA) device and the sensor 3 can be exemplified by a thermistor used for temperature management for products in a production procedure or a thermistor used for temperature management of a heater that performs heating when a production procedure includes a heating procedure. In addition, the temperature value, which is the physical quantity obtained by the AD conversion apparatus 100, is output to a programmable controller that controls the FA device and is reflected in the procedure control.

The resistor 4 is a voltage dividing resistive element and is disposed between the constant voltage line and the sensor 3.

The constant voltage generation unit 5 is a constant voltage generation circuit that generates a constant voltage. The constant voltage line is connected to the output of the constant voltage generation unit 5 and a power supply line of a power supply circuit of the AD conversion apparatus 100 can be exemplified as the constant voltage generation unit 5. Here, as an example, the voltage generated and output by the constant voltage generation unit 5 is assumed to be 5 V.

The control unit 6 receives the analog output of the sensor 3 so as to output a reference voltage switching signal to the reference voltage switching unit 2 and output a command to the AD conversion unit 1, and it then receives a result from the AD conversion unit 1 and outputs display data to the display unit 7. The control unit 6 can, for example, be implemented by a microcomputer.

In addition, the display unit 7 is a display unit that performs display in accordance with the display data from the control unit 6.

Note that, in FIG. 1, although the AD conversion apparatus 100 that includes the AD conversion unit 1, the reference voltage switching unit 2, the sensor 3, the resistor 4, the constant voltage generation unit 5, the control unit 6, and the display unit 7 is exemplified, the present invention is not limited to this configuration. As long as the AD conversion apparatus 100 includes at least the AD conversion unit 1, the reference voltage switching unit 2, and the control unit 6, then the other components may be implemented by an external device connected to the AD conversion apparatus 100.

Figure 2:
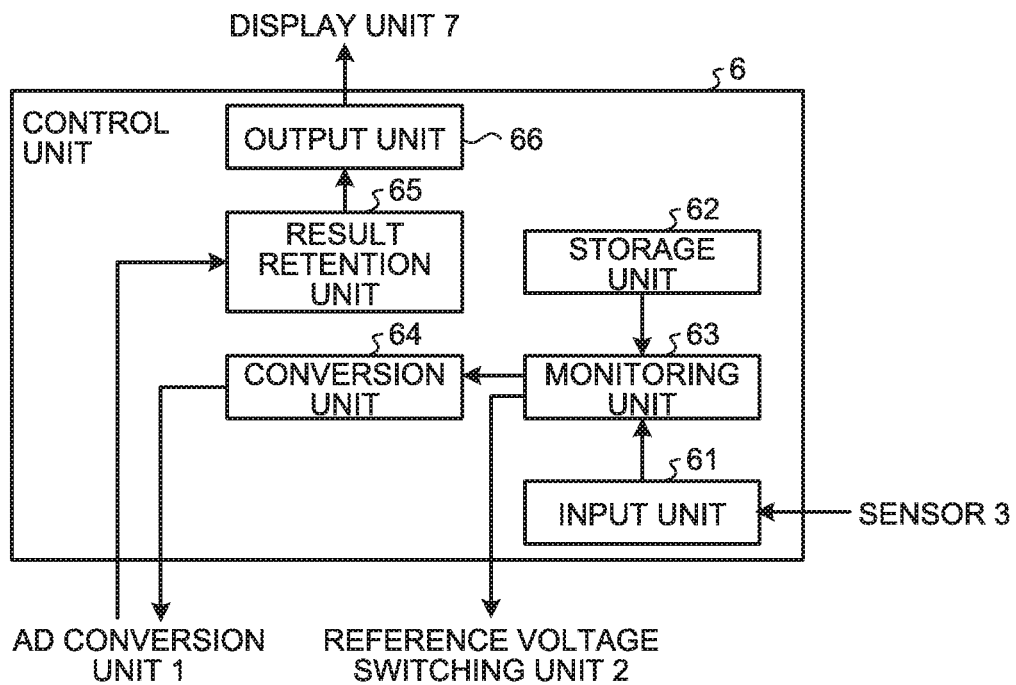
FIG. 2 is a functional block diagram illustrating an example configuration of a control unit illustrated in FIG. 1.

FIG. 2 is a functional block diagram illustrating an example configuration of the control unit 6 illustrated in FIG. 1. The control unit 6 illustrated in FIG. 2 includes an input unit 61, a storage unit 62, a monitoring unit 63, a conversion unit 64, a result retention unit 65, and an output unit 66. The input unit 61 acquires the output value of the sensor 3. Specifically, the input unit 61 divides a constant voltage generated by the constant voltage generation unit 5 illustrated in FIG. 1 by using the resistor 4 and the sensor 3, and it acquires the value obtained by the voltage division as the output value of the sensor 3. The storage unit 62 stores a preset reference voltage switching threshold value, which is a reference voltage switching point. Note that, in the following description, the reference voltage switching point will also simply be referred to as a switching point. The monitoring unit 63 compares the output value of the sensor 3 from the input unit 61 with the reference voltage switching threshold value preset in the storage unit 62 and outputs a monitoring result. The conversion unit 64 outputs, to the reference voltage switching unit 2, a command on the basis of the monitoring result from the monitoring unit 63. The result retention unit 65 retains a conversion result from the AD conversion unit 1. The output unit 66 outputs, to the display unit 7, display data on the basis of the conversion result from the AD conversion unit 1, which is retained in the result retention unit 65.

Figure 3:
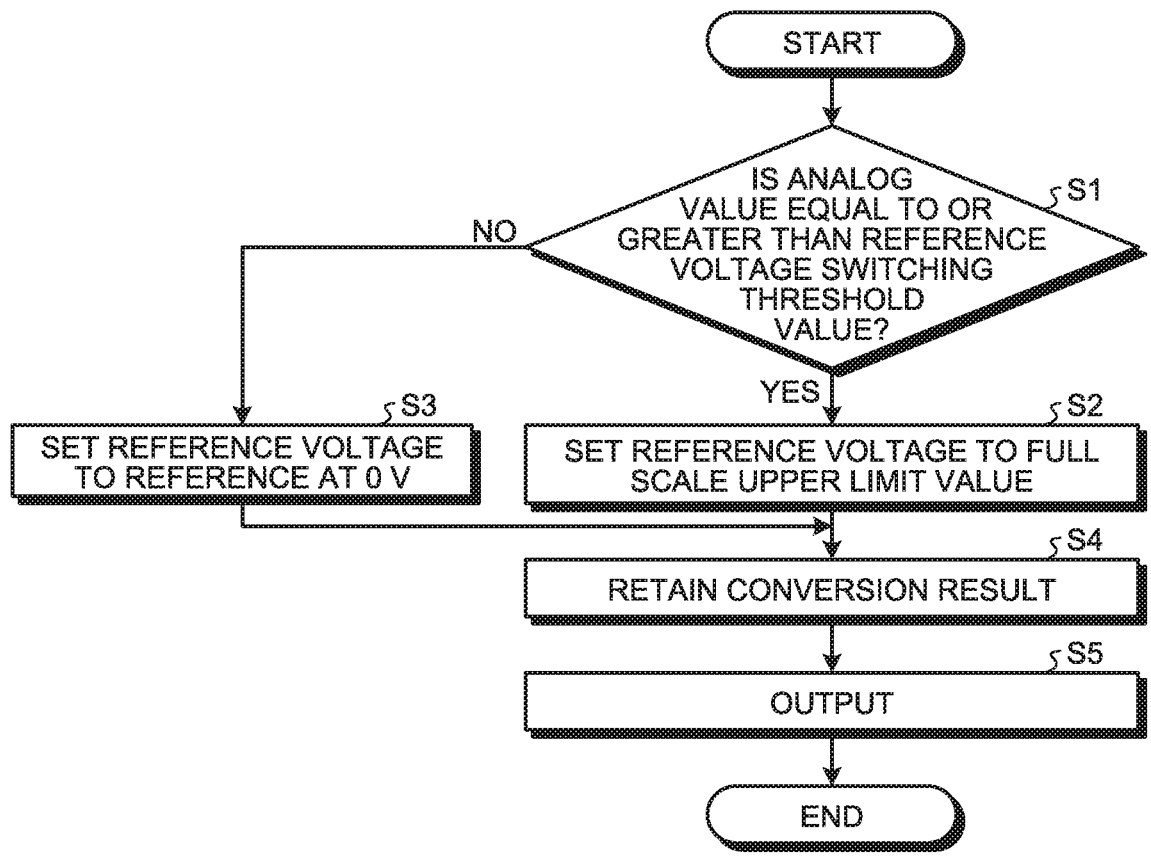
FIG. 3 is a flowchart illustrating an example operation of the control unit illustrated in FIG. 1.

FIG. 3 is a flowchart illustrating an example operation of the control unit 6 illustrated in FIG. 1. First, the process is started and the monitoring unit 63 determines whether an analog value, which is the output value of the sensor 3, is equal to or greater than the reference voltage switching threshold value (S1). When the analog value is equal to or greater than the reference voltage switching threshold value (S1: Yes), the conversion unit 64 sets the reference voltage to the full scale upper limit value, which is a second reference voltage (S2). When the analog value is not equal to or greater than the reference voltage switching threshold value (S1: No), the conversion unit 64 sets the reference voltage to the ground voltage at 0 V, which is a first reference voltage (S3). Then, after setting the reference voltage, the conversion unit 64 outputs a command to the AD conversion unit 1, and the conversion result from the AD conversion unit 1 is retained in the result retention unit 65 (S4). Thereafter, the result retained in the result retention unit 65 is output from the output unit 66 to the display unit 7 as display data (S5) and the process ends.

The control unit 6 illustrated in FIG. 2 compares the output value of the sensor 3 with the reference voltage switching threshold value and switches the reference voltage depending on the output value of the sensor 3, thereby preventing overlapping of a region where the gain error of the AD conversion unit 1 is larger and a region where the sensitivity of the sensor 3 is lower, and this reduces the maximum value of measurement error derived from the gain error at the full scale.

Figure 4:
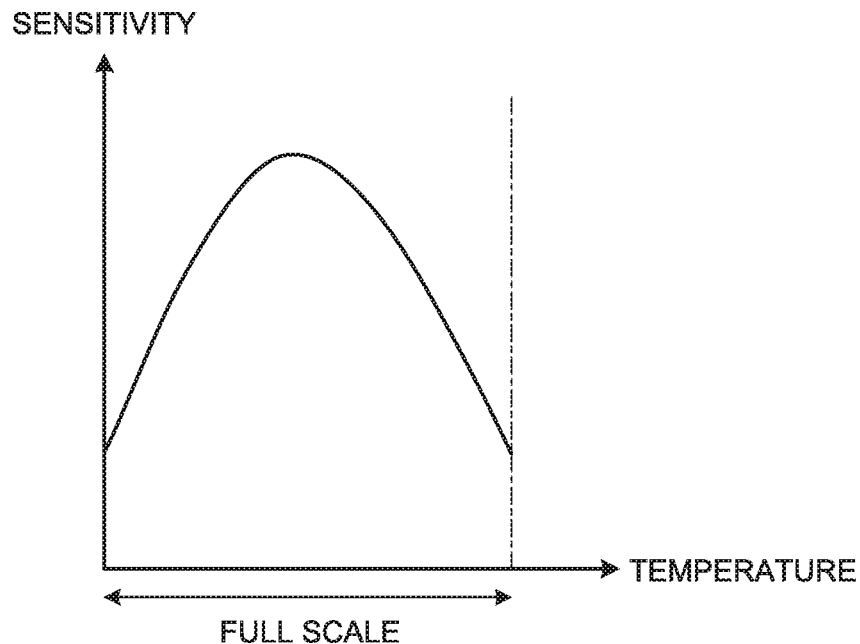
FIG. 4 is a diagram illustrating the peak sensitivity of the sensor illustrated in FIG. 1, with the horizontal axis representing temperature and the vertical axis representing sensitivity.

FIG. 4 is a diagram illustrating peak sensitivity for the sensor 3 illustrated in FIG. 1, with the horizontal axis representing temperature and the vertical axis representing sensitivity. In FIG. 4, the peak sensitivity is present near the center of the full scale.

Figure 5:
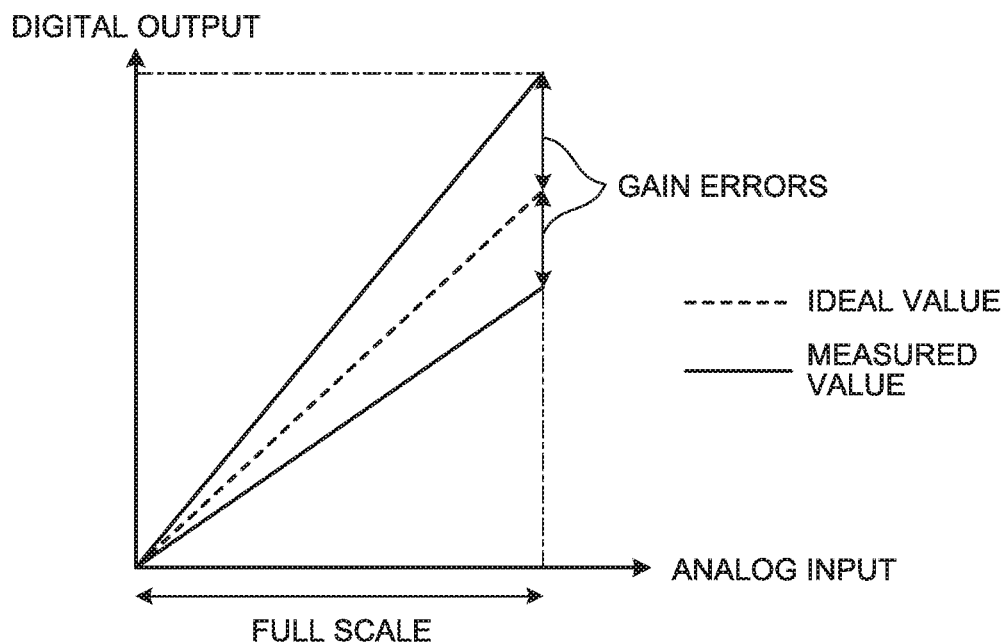
FIG. 5 is a diagram illustrating gain errors between an ideal value and measured values for the AD conversion unit illustrated in FIG. 1, with the horizontal axis representing analog input and the vertical axis represents digital output

FIG. 5 is a diagram illustrating gain errors between an deal value and measured values for the AD conversion unit 1 illustrated in FIG. 1, with the horizontal axis representing analog input and the vertical axis representing digital output. In a case where the AD conversion is performed in a system in which the analog input increases as the value of a measurement object increases, by using the sensor 3 having the peak sensitivity illustrated in FIG. 4 and the AD conversion unit 1 having the gain errors illustrated in FIG. 5, the input value of the AD conversion unit 1 or the conversion result from the AD conversion unit 1 corresponding to the position of the peak sensitivity is utilized as a conversion threshold value and, in conversion using a region with a temperature lower than the peak, i.e., a region on a side where the analog input is smaller, the conversion result with 0 V as the reference voltage is used. In contrast, in conversion using a region with a temperature higher than the peak, i.e., a region on a side where the analog input is larger, the conversion result with the full scale upper limit value as the reference voltage is used. As a result of using two regions, the region where the gain error of the AD conversion unit 1 is larger and the low sensitivity region of the sensor 3 can be prevented from overlapping. Even in a case where the AD conversion is performed in a system in which the analog input increases as the value of a measurement object decreases, by using a sensor having the peak sensitivity illustrated in FIG. 4, the conversion is performed by using the full scale upper limit value as a reference in a region where the value of the measurement object is lower, i.e., a region on the left side of the peak, where the analog input increases and the conversion is performed by using 0 V as a reference in a region where the value of the measurement object is smaller, i.e., a region on the right side of the peak, where the analog input decreases, whereby the region with a larger gain error and the low sensitivity region of the sensor can be prevented from overlapping. Furthermore, the reference voltage switching point, which is a reference value for switching the conversion, can be set, by a user using an engineering tool (described later), according to the specifications of the sensor being used.

Figure 6:
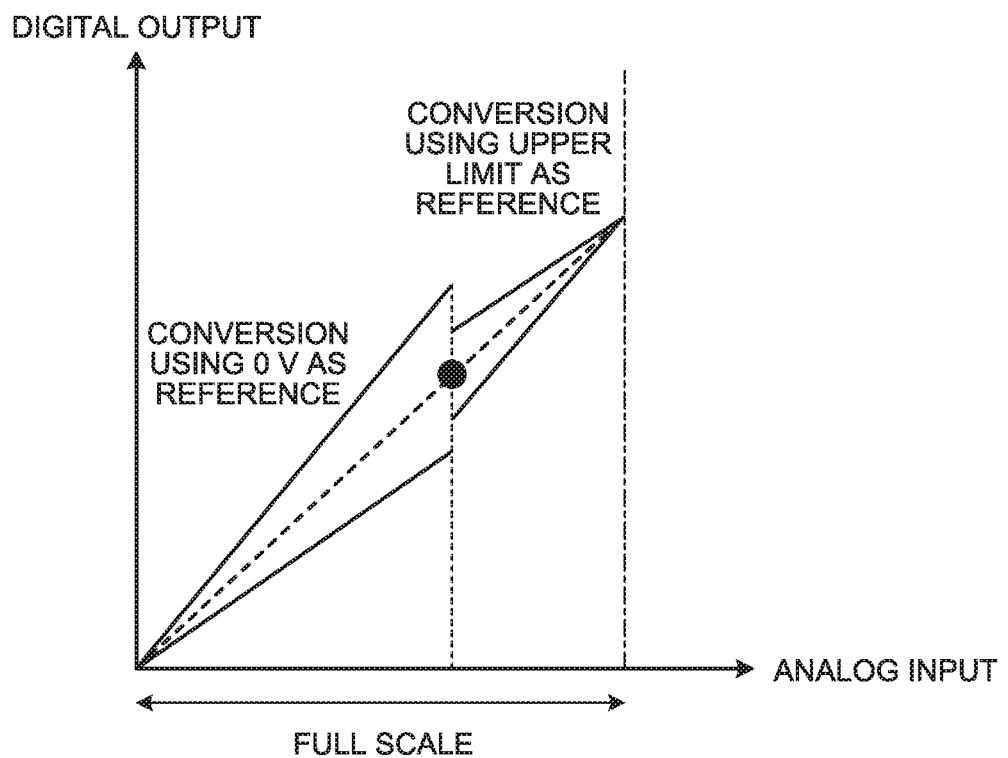
FIG. 6 is a diagram describing how a gain error can be reduced by switching between conversion using 0 V as a reference voltage and conversion using a full scale upper limit value as a reference voltage, with the horizontal axis representing analog input and the vertical axis representing digital input.

FIG. 6 is a diagram describing how a gain error can be reduced by switching between conversion using 0 V as a reference voltage and conversion using the full scale upper limit value as a reference voltage, with the horizontal axis representing analog input and the vertical axis representing digital input. The black solid circle illustrated in FIG. 6 denotes the reference voltage switching point. When the reference voltage is 0 V, the gain error increases as the analog input value increases. In contrast, when the reference voltage is the full scale upper limit value, the gain error increases as the analog input value decreases. Thus, as illustrated in FIG. 6, by controlling the reference voltage such that it is 0 V in a region where the analog input value is smaller and controlling the reference voltage such that it is the full scale upper limit value in a region where the analog input value is larger, the gain error can be reduced.

Figure 7:
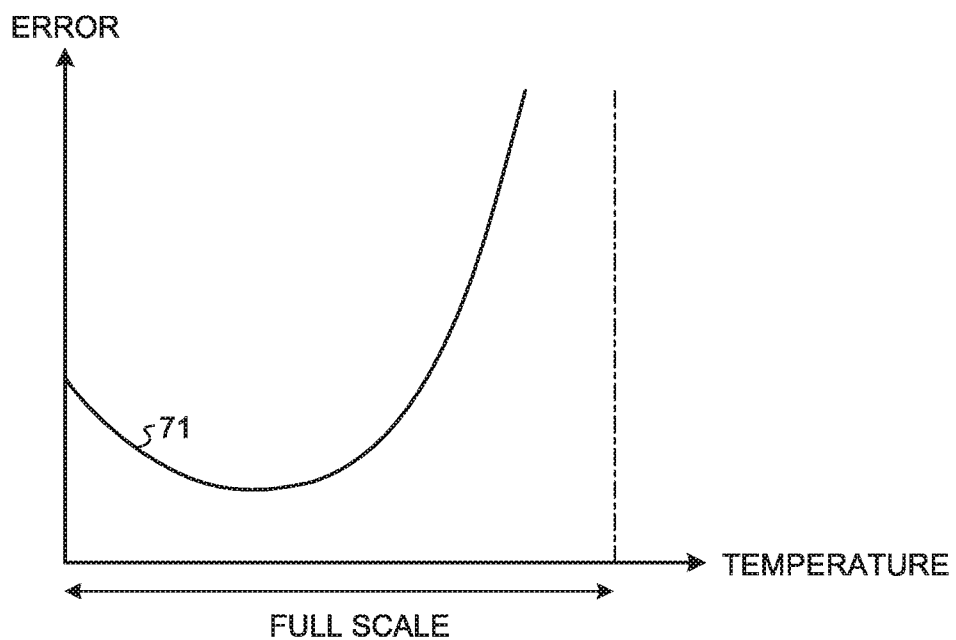
FIG. 7 is a diagram illustrating a curve representing a change in error with respect to temperature when the reference voltage is 0 V, with the horizontal axis representing temperature and the vertical axis representing the error.
Figure 8:
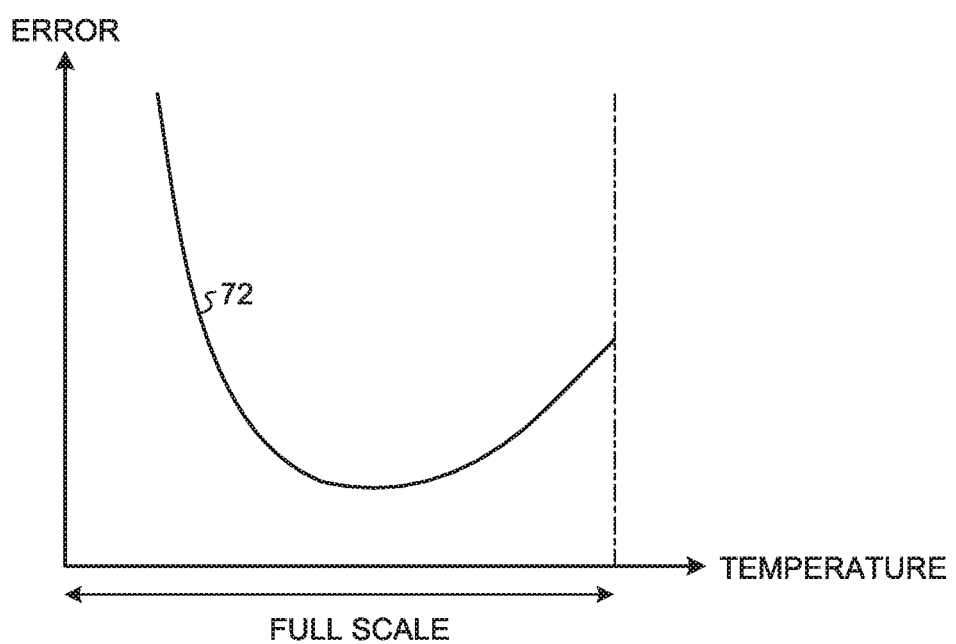
FIG. 8 is a diagram illustrating a curve representing a change in error with respect to temperature when the reference voltage is 5 V, which is the output voltage of a constant voltage generation circuit, with the horizontal axis representing temperature and the vertical axis representing the error.

FIG. 7 is a diagram illustrating a curve 71 representing a change in error with respect to temperature when the reference voltage is 0 V with the horizontal axis representing temperature and the vertical axis representing the error. FIG. 8 is a diagram illustrating a curve 72 representing a change in error with respect to temperature when the reference voltage is 5 V, which is the output voltage of the constant voltage generation circuit, with the horizontal axis representing temperature and the vertical axis representing the error. In FIG. 7, the error is smaller on the lower temperature side of the center of the full scale and the error is larger on the higher temperature side of the center of the full scale; in contrast to this, in FIG. 8, the error is smaller on the higher temperature side of the center of the full scale and the error is larger on the lower temperature side of the center of the full scale.

Figure 9:
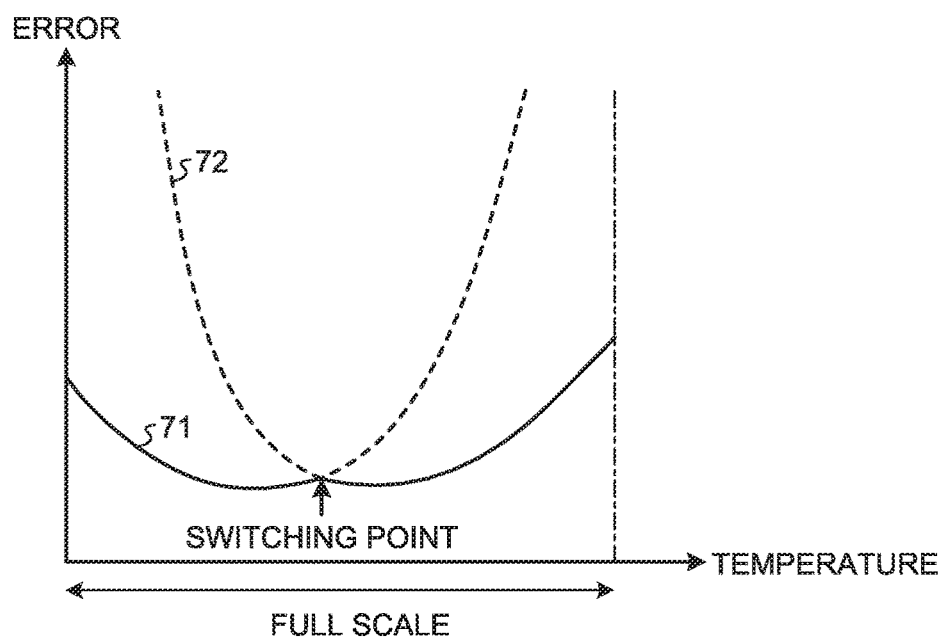
FIG. 9 is a diagram in which the curve illustrated in FIG. 7 and the curve illustrated in FIG. 8 are superimposed on each other.

FIG. 9 is a diagram in which the curve 71 illustrated in FIG. 7 and the curve 72 illustrated in FIG. 8 are superimposed on each other. By switching the reference voltage such that the curve 71 is adopted using 0 V as a reference voltage on the lower temperature side of the switching point illustrated in FIG. 9 and the curve 72 is adopted using 5 V as a reference voltage on the higher temperature side of the switching point, it is possible to expand the temperature range in which the error is reduced when compared with the cases in FIGS. 7 and 8, which are cases where the reference voltage is not switched. Consequently, the temperature range in which the detection accuracy of the AD conversion apparatus 100 can be kept higher can be expanded. Additionally, because a region having a very large error is not used, which is the case in the higher temperature side in FIG. 7 and the lower temperature side in FIG. 8, the maximum value of the error can also be reduced. Note that the errors illustrated in FIGS. 7 to 9 are conversion errors.

In addition, the switching point of the reference voltage illustrated in FIG. 9 is simply set by the engineering tool and, with this engineering tool, a value stored in the storage unit 62 can be modified. By operating the engineering tool, the user can set the switching point by inputting the numerical value as a percentage of the full scale or by setting a percentage of the full scale on an operation screen with a pointing device. Setting the switching point of the reference voltage in accordance with the position of the peak sensitivity or operating temperature range of the sensor makes it possible to reduce the maximum value of the error.

Furthermore, as another configuration, both of a first AD conversion result when 0 V is used as a reference and a second AD conversion result when the full scale upper limit value at 5 V is used as a reference may be acquired for an input value and one of the two AD conversion results may be used. Specifically, with this configuration, the conversion result that suits the conditions is automatically adopted on the basis of the numerical value of the percentage of the full scale, which is the set switching point.

Alternatively, both of the first AD conversion result when 0 V is used as a reference and the second AD conversion result when the full scale upper limit value at 5 V is used as a reference may be acquired for an input value and the conversion result may be calculated by computing the two AD conversion results. With this technique, the conversion result can be calculated by using a uniform process regardless of the input value.

As described above, with the configuration illustrated in FIG. 1, it is possible to obtain an AD conversion apparatus capable of reducing an error when used at the full scale without expanding the circuit scale by preventing overlapping of a region where the gain error of the AD conversion increases and the low sensitivity region of the sensor.

However, the present invention is not limited to the configuration illustrated in FIG. 1. Hereinafter, examples of modifications of the AD conversion apparatus according to the present embodiment will be indicated.

Figure 10:
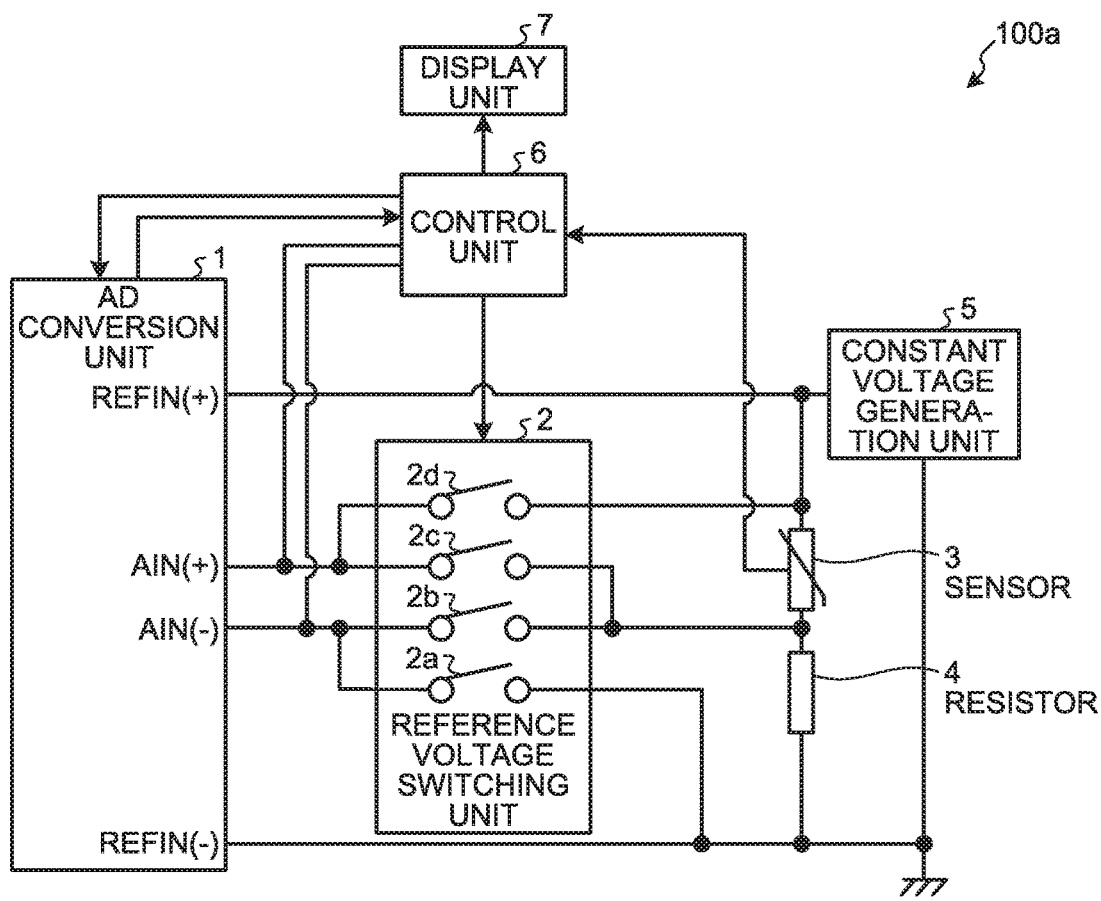
FIG. 10 is a diagram illustrating a first modification example, which is an example configuration of the AD conversion apparatus according to the embodiment.

FIG. 10 is a diagram illustrating a first example modification, which is an example configuration of the AD conversion apparatus according to the embodiment of the present invention. An AD conversion apparatus 100a illustrated in FIG. 10 is obtained by disposing the resistor 4 at the position of the sensor 3 of the AD conversion apparatus 100 illustrated in FIG. 1 and disposing the sensor 3 at the position of the resistor 4 thereof. Also with the AD conversion apparatus 100a illustrated in FIG. 10, the present invention can be implemented similarly to the AD conversion apparatus 100 illustrated in FIG. 1 and a similar effect can be obtained.

Figure 11:
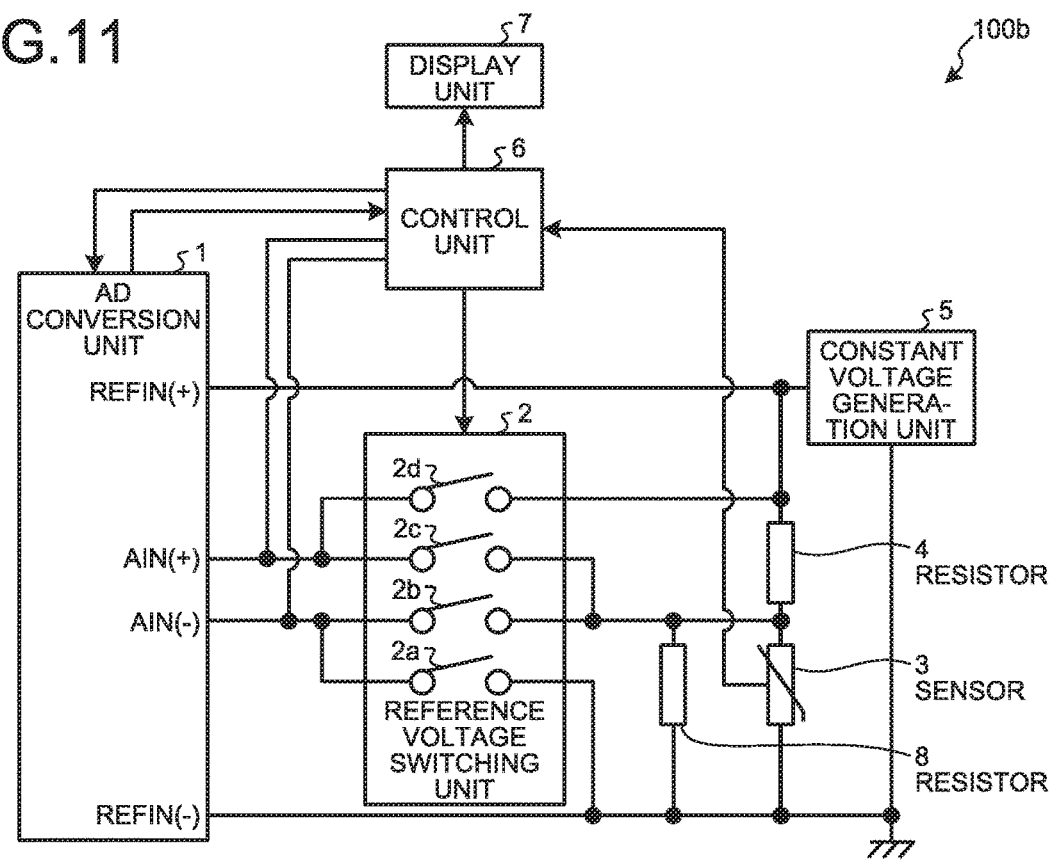
FIG. 11 is a diagram illustrating a second modification example, which is an example configuration of the AD conversion apparatus according to the embodiment.

FIG. 11 is a diagram illustrating a second example modification, which is an example configuration of the AD conversion apparatus according to the embodiment of the present invention. An AD conversion apparatus 100b illustrated in FIG. 11 is obtained by connecting a resistor 8 in parallel with the sensor 3 of the AD conversion apparatus 100 illustrated in FIG. 1. Also with the AD conversion apparatus 100b illustrated in FIG. 11, the present invention can be implemented similarly to the AD conversion apparatus 100 illustrated in FIG. 1 and a similar effect can be obtained.

Figure 12:
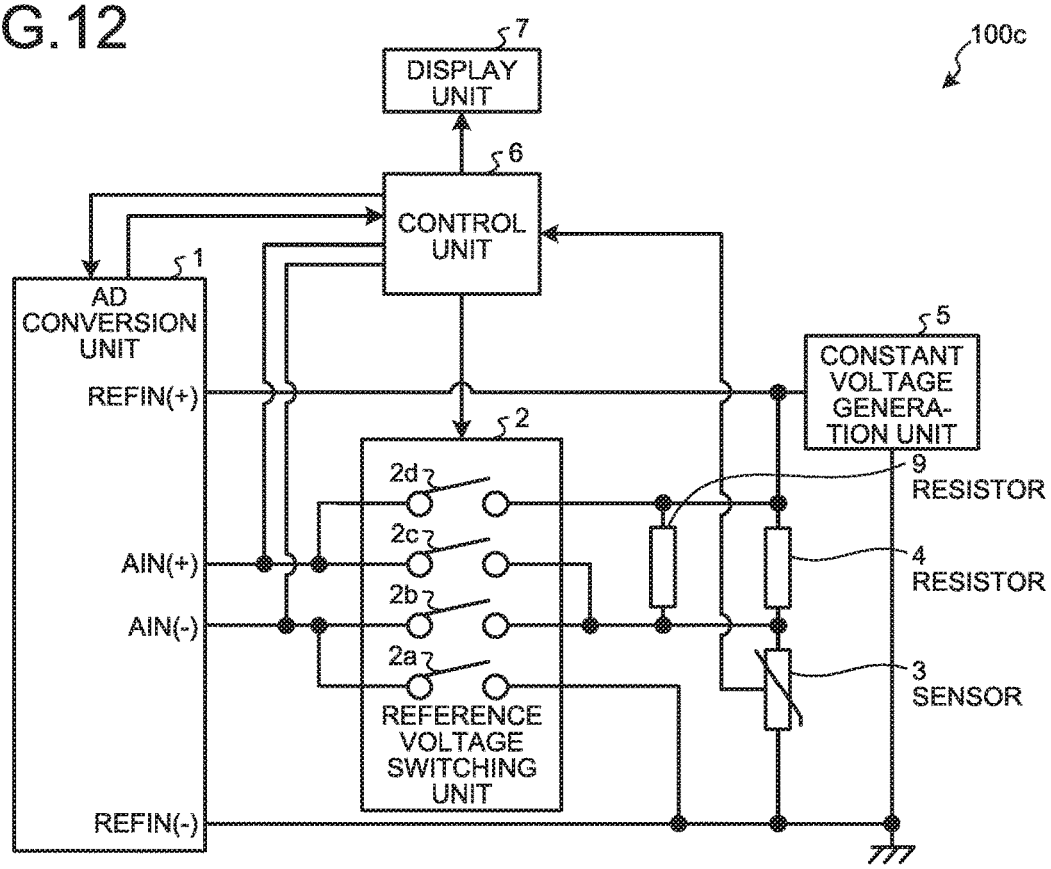
FIG. 12 is a diagram illustrating a third modification example, which is an example configuration of the AD conversion apparatus according to the embodiment.

FIG. 12 is a diagram illustrating a third example modification, which is an example configuration of the AD conversion apparatus according to the embodiment of the present invention. An AD conversion apparatus 100c illustrated in FIG. 12 is obtained by connecting a resistor 9 in parallel with the resistor 4 of the AD conversion apparatus 100 illustrated in FIG. 1. Also with the configuration illustrated in FIG. 12, the present invention can be implemented similarly to the configuration illustrated in FIG. 1 and a similar effect can be obtained.

Figure 13:
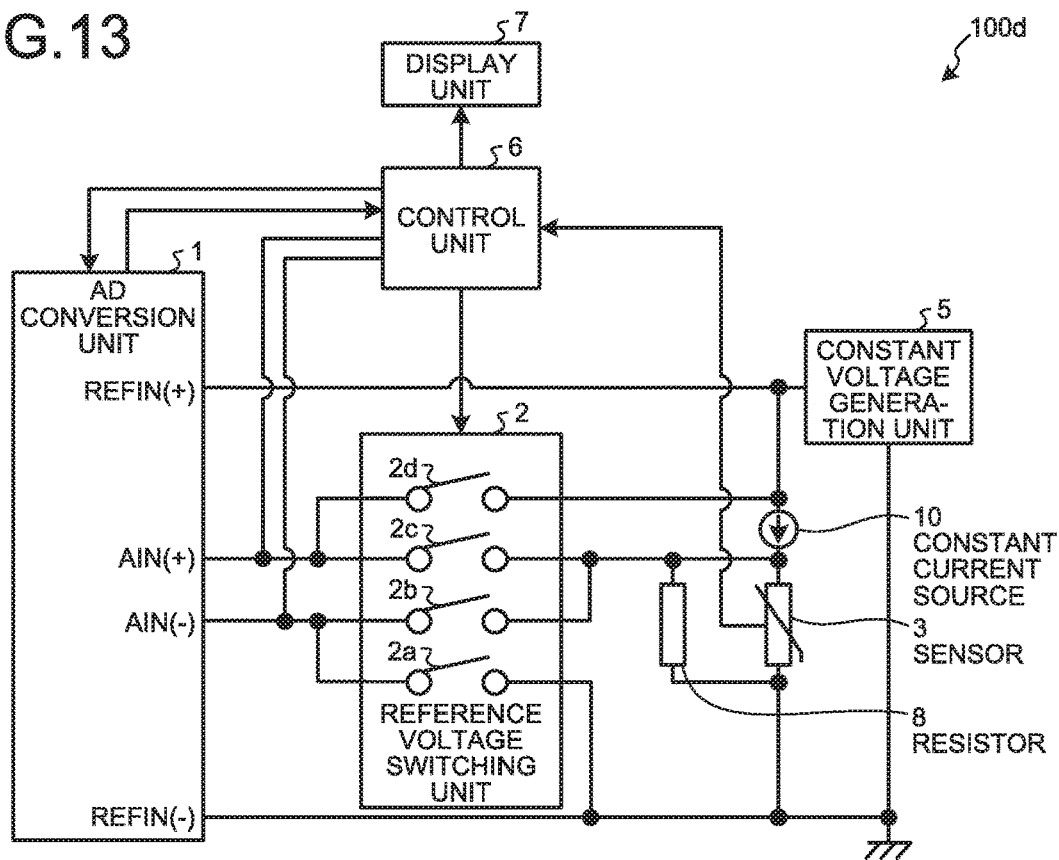
FIG. 13 is a diagram illustrating a fourth modification example, which is an example configuration of the AD conversion apparatus according to the embodiment.

FIG. 13 is a diagram illustrating a fourth example modification, which is an example configuration of the AD conversion apparatus according to the embodiment of the present invention. An AD conversion apparatus 100d illustrated in FIG. 13 is obtained by providing a constant current source 10 at the position of the resistor 4 of the AD conversion apparatus 100b illustrated in FIG. 11. Also with the configuration illustrated in FIG. 13, the present invention can be implemented similarly to the configuration illustrated in FIG. 1 and a similar effect can be obtained. Note that the AD conversion apparatus 100d illustrated in FIG. 13 can be operated in a constant current mode.

Figure 14:
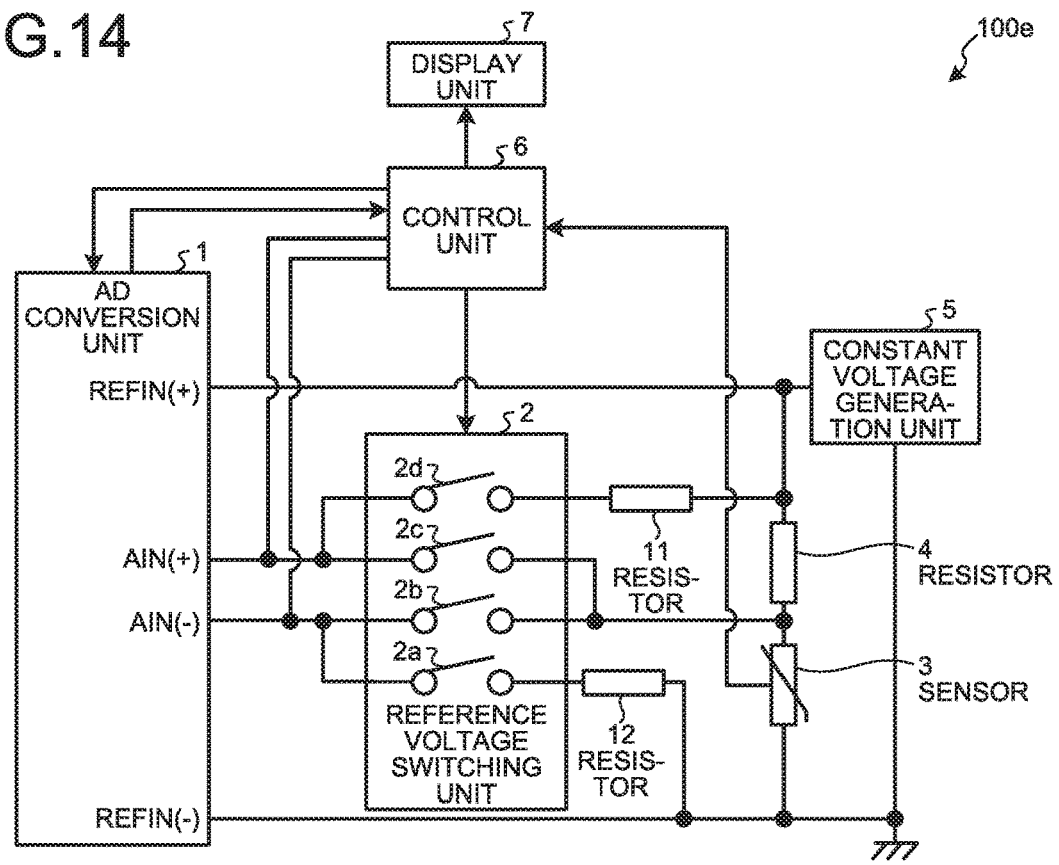
FIG. 14 is a diagram illustrating a fifth modification example, which is an example configuration of the AD conversion apparatus according to the embodiment.

FIG. 14 is a diagram illustrating a fifth example modification, which is an example configuration of the AD conversion apparatus according to the embodiment of the present invention. An AD conversion apparatus 100e illustrated in FIG. 14 is obtained by adding a resistor 11 between the constant voltage line connected to the output of the constant voltage generation unit 5 and the switch 2d of the AD conversion apparatus 100 illustrated in FIG. 1 and by adding a resistor 12 between the ground line and the switch 2a. Also with the AD conversion apparatus 100e illustrated in FIG. 14, the present invention can be implemented similarly to the AD conversion apparatus 100 illustrated in FIG. 1 and a similar effect can be obtained. Note that, with the AD conversion apparatus 100e illustrated in FIG. 14, the reference voltage can be adjusted to another value between 0 V and the full scale upper limit value by using the resistors 11 and 12. If it is assumed that the voltage drop due to each of the resistors 11 and 12 is 1 V, then the voltage of AIN(+) of the AD conversion unit 1 when the switch 2d is turned on is 4 V and the voltage of AIN(−) of the AD conversion unit 1 when the switch 2a is turned on is 1 V.

In addition, in the present embodiment, the AD conversion unit 1 and the reference voltage switching unit 2 may be provided in a single integrated circuit (IC), or they may be provided in different ICs.

Figure 15:
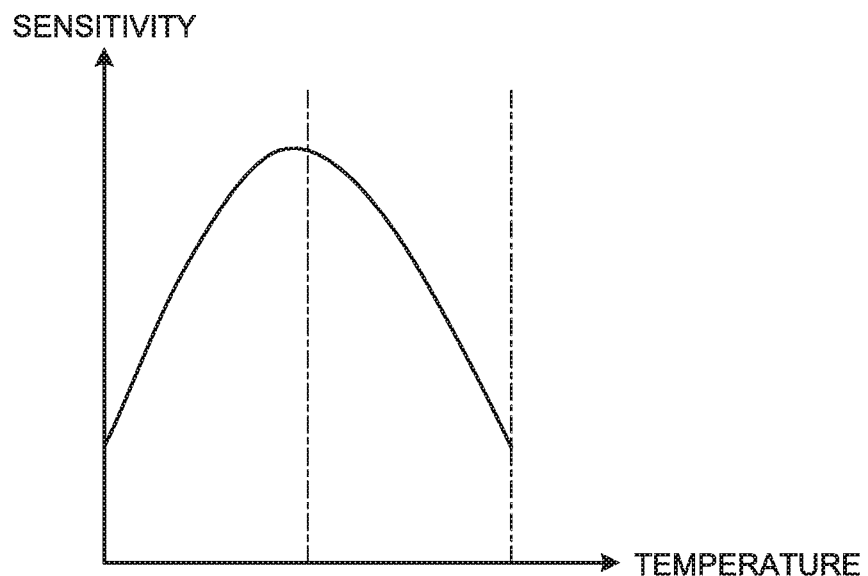
FIG. 15 is a diagram illustrating the peak sensitivity of a sensor whose peak sensitivity is located near the center of the full scale, with the horizontal axis representing temperature and the vertical axis representing sensitivity.

Furthermore, in the present embodiment, multiplication by a given gain may be provided at the time of AD conversion. FIG. 15 is a diagram illustrating the peak sensitivity for the sensor 3 whose peak sensitivity is located near the center of the full scale, with the horizontal axis representing temperature and the vertical axis representing sensitivity. As illustrated in FIG. 15, when the sensor 3 whose peak sensitivity is located near the center of the full scale is used, the gain can be set to 1 or 2 for AD conversion using 0 V as a reference and for AD conversion using the full scale upper limit value as a reference.

Figure 16:
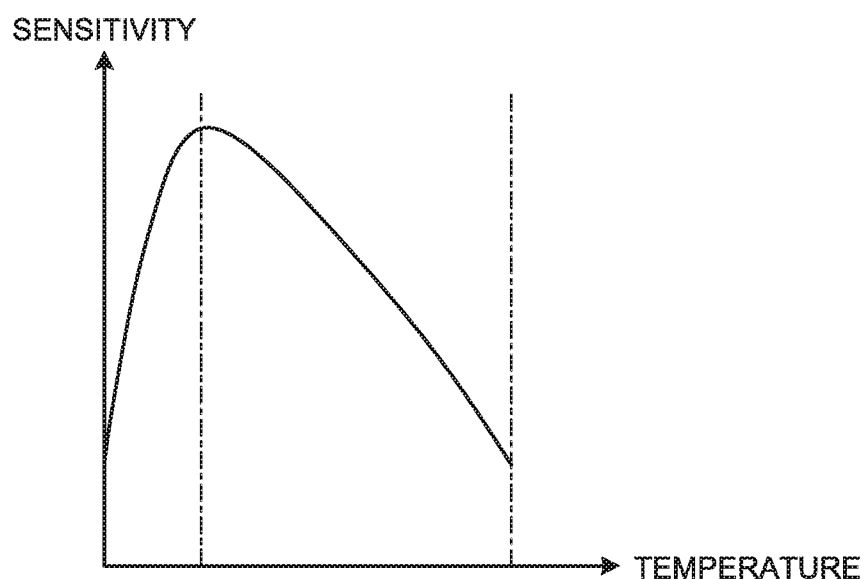
FIG. 16 is a diagram illustrating the peak sensitivity of a sensor whose peak sensitivity is located about ¼ of the full scale, with the horizontal axis representing temperature and the vertical axis representing sensitivity.

FIG. 16 is a diagram illustrating the peak sensitivity for the sensor 3 whose peak sensitivity is located about ¼ of the full scale, with the horizontal axis representing temperature and the vertical axis representing sensitivity. As illustrated in FIG. 16, when the sensor 3 whose peak sensitivity is located about ¼ of the full scale as used, the gain can be set to 1, 2 or 4 when 0 V is used as a reference voltage and the gain can be set to 1 when the full scale upper limit value of 5 V is used as a reference voltage. As illustrated in FIGS. 15 and 16, when multiplication by a given gain may be provided at the time of AD conversion, the gain can be set in accordance with the position of the peak sensitivity of the sensor.

Figure 17:
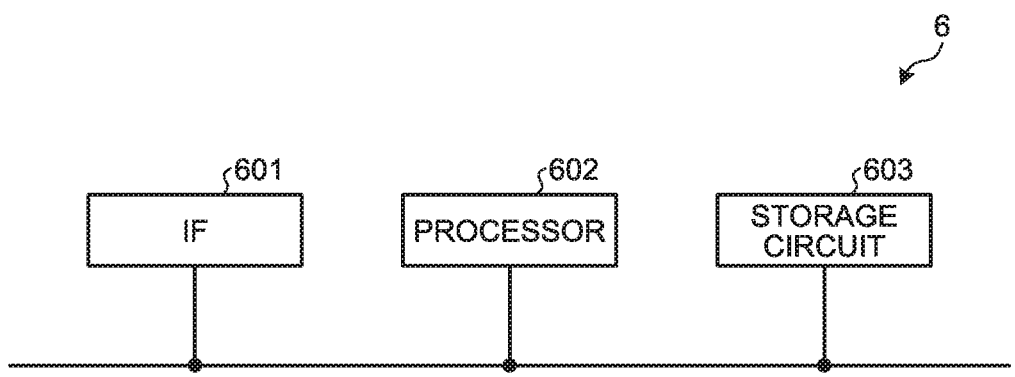
FIG. 17 is a diagram illustrating an example configuration of hardware that implements the control unit illustrated in FIG. 1.

Finally, a hardware configuration for implementing the control unit 6 illustrated in FIG. 1 will be described. FIG. 17 is a diagram illustrating an example configuration of hardware that implements the control unit 6 illustrated in FIG. 1. FIG. 17 illustrates an IF 601 as an interface, a processor 602, and a storage circuit 603. The processor 602 executes programs and performs arithmetic operations. The processor 602 is typically a central processing unit (CPU). The storage circuit 603 stores programs to be executed by the processor 602 and also stores necessary data when the processor 602 executes programs and performs arithmetic operations. The IF 601 has a configuration that implements external input/output of the control unit 6. Note that a plurality of individual IFs 601, processors 602, and storage circuits 603 may be provided.

As described above, according to the present embodiment, an error produced at the time of AD conversion can be reduced. Therefore, the accuracy of the AD conversion apparatus can be improved and the usage environment of the AD conversion apparatus can be expanded.

The configurations illustrated in the above embodiment indicate examples of the content of the present invention and can be combined with another known technology. Part of the configurations can also be omitted and modified without departing from the gist of the present invention.

REFERENCE SIGNS LIST

1 AD conversion unit; 2 reference voltage switching unit; 2a, 2b, 2c, 2d switch; 3 sensor; 4, 8, 9, 11, 12 resistor; 5 constant voltage generation unit; 6 control unit; 7 display unit; 10 constant current source; 61 input unit; 62 storage unit; 63 monitoring unit; 64 conversion unit; 65 result retention unit; 66 output unit; 71, 72 curve; 100, 100a, 100b, 100c, 100d, 100e AD conversion apparatus; 601 IF 602 processor; 603 storage circuit.

The invention claimed is:

1. An analog-to-digital conversion apparatus comprising:
an analog-to-digital converter;
a reference voltage switch disposed between an output of a sensor and an analog input terminal of the analog-to-digital converter and connectable to an output of the sensor and a plurality of reference voltage lines; and
control circuitry to control switching a reference voltage input to the analog-to-digital converter by connecting the reference voltage switch to one of the reference voltage lines and to the output of the sensor, wherein
an analog output value of the sensor is input to the analog input terminal of the analog-to-digital converter via the reference voltage switch and is converted into a digital value, and
an output of the analog-to-digital converter is multiplied by a gain and is output.

2. The analog-to-digital conversion apparatus according to claim 1, wherein
the sensor has a characteristic that sensitivity varies depending on a usage environment, and
the reference voltage switch is set such that the reference voltage is switched depending on the sensitivity of the sensor.

3. An analog-to-digital conversion apparatus comprising:
an analog-to-digital converter;
a reference voltage switch disposed between an output of a sensor and an analog input terminal of the analog-to-digital converter and connectable to an output of the sensor and a plurality of reference voltage lines; and
control circuitry to control switching a reference voltage input to the analog-to-digital converter by connecting the reference voltage switch to one of the reference voltage lines and to the output of the sensor, wherein
an analog output value of the sensor is input to the analog input terminal of the analog-to-digital converter via the reference voltage switch and is converted into a digital value,
the analog-to-digital conversion apparatus further comprising constant voltage generation circuitry, wherein
the reference voltage lines include a first reference voltage line, which has a first reference voltage, and a second reference voltage line, which has a second reference voltage higher than the first reference voltage.

4. The analog-to-digital conversion apparatus according to claim 3, wherein
the first reference voltage line is a ground line, and
the second reference voltage line is connected to an output of the constant voltage generation circuitry.

5. The analog-to-digital conversion apparatus according to claim 1, further comprising:
constant voltage generation circuitry,
wherein:
an output value of the constant voltage generation circuitry is a full scale upper limit value, and
a switching point at which the reference voltage is switched is set to a percentage of the full scale upper limit value.

6. The analog-to-digital conversion apparatus according to claim 5, wherein
a first analog-to-digital conversion result, which is output from the analog-to-digital converter connected to the output of the sensor and the first reference voltage line, and a second analog-to-digital conversion result, which is output from the analog-to-digital converter connected to the output of the sensor and the second reference voltage line, are calculated, and
the first analog-to-digital conversion result or the second analog-to-digital conversion result is output as a percentage of the full scale upper limit value.

7. The analog-to-digital conversion apparatus according to claim 5, wherein
a first analog-to-digital conversion result, which is output from the analog-to-digital converter connected to the output of the sensor and the first reference voltage line, and a second analog-to-digital conversion result, which is output from the analog-to-digital converter connected to the output of the sensor and the second reference voltage line, are calculated, and
the first analog-to-digital conversion result and the second analog-to-digital conversion result are computed and a conversion result is output.

8. An analog-to-digital conversion method to convert an analog output value from a sensor into a digital value and compare the converted digital value with a first reference voltage or a second reference voltage, the analog-to-digital conversion method comprising:
determining whether the analog output value from the sensor is equal to or greater than a preset reference voltage switching threshold value;
converting the analog output value into a digital value using the first reference voltage as a reference voltage when the analog output value is not equal to or greater than the reference voltage switching threshold value; and converting the analog output value into a digital value using the second reference voltage, which is higher than the first reference voltage, as a reference voltage when the analog output value is equal to or greater than the reference voltage switching threshold value.

9. The analog-to-digital conversion method according to claim 8, further comprising:
setting the reference voltage switching threshold value based on a sensitivity characteristic of the sensor that varies depending on a usage environment.

10. The analog-to-digital conversion method according to claim 8, wherein the first reference voltage line is a ground line.

11. The analog-to-digital conversion apparatus according to claim 1, wherein
the reference voltage switch is set such that the reference voltage is switched depending on an output of the sensor and a predetermined reference voltage switching threshold.

12. The analog-to-digital conversion apparatus according to claim 9, further comprising:
a memory circuit configured to store the predetermined reference voltage switching threshold.

* * * * *